(12) United States Patent
Goto

(10) Patent No.: US 11,510,310 B2
(45) Date of Patent: Nov. 22, 2022

(54) PRINTING APPARATUS

(71) Applicant: SEIKO EPSON CORPORATION, Tokyo (JP)

(72) Inventor: Junichi Goto, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 933 days.

(21) Appl. No.: 16/291,530

(22) Filed: Mar. 4, 2019

(65) Prior Publication Data
US 2019/0281693 A1    Sep. 12, 2019

(30) Foreign Application Priority Data

Mar. 6, 2018 (JP) .............................. JP2018-039990

(51) Int. Cl.
| | |
|---|---|
| *B41J 2/045* | (2006.01) |
| *H05K 1/02* | (2006.01) |
| *B41J 29/377* | (2006.01) |
| *B41J 2/14* | (2006.01) |

(52) U.S. Cl.
CPC ........ *H05K 1/0209* (2013.01); *B41J 2/04515* (2013.01); *B41J 2/14* (2013.01); *B41J 29/377* (2013.01); *B41J 2202/08* (2013.01); *B41J 2202/13* (2013.01)

(58) Field of Classification Search
CPC ....... H05K 1/0209; B41J 2/04515; B41J 2/14; B41J 29/377; B41J 2202/08; B41J 2202/13; B41J 2/1408; B41J 2/235
See application file for complete search history.

(56) References Cited

U.S. PATENT DOCUMENTS

| | | |
|---|---|---|
| 5,831,374 A | 11/1998 | Morita et al. |
| 6,371,594 B1 | 4/2002 | Takahashi et al. |
| 6,386,672 B1 | 5/2002 | Kimura et al. |
| 2004/0189730 A1 | 9/2004 | Kubo |
| 2004/0227788 A1 | 11/2004 | Katayama |
| 2006/0185896 A1 | 8/2006 | Ikeda |
| 2014/0224467 A1 | 8/2014 | Yokota et al. |
| 2018/0022085 A1 | 1/2018 | Ishizaki |
| 2018/0029395 A1 | 2/2018 | Sugiura et al. |
| 2018/0154664 A1 | 6/2018 | Sugiura et al. |
| 2019/0084325 A1 | 3/2019 | Sugiura et al. |

FOREIGN PATENT DOCUMENTS

| | | |
|---|---|---|
| CN | 1672944 | 9/2005 |
| EP | 3275661 | 1/2018 |
| JP | H10-071715 | 3/1998 |
| JP | 2003-218294 | 7/2003 |
| JP | 2006-054230 | 2/2006 |
| JP | 2006-237060 A | 9/2006 |
| JP | 2012-187838 A | 10/2012 |
| JP | 2013-051386 A | 3/2013 |

*Primary Examiner* — Kristal Feggins
(74) *Attorney, Agent, or Firm* — Workman Nydegger

(57) ABSTRACT

A printer includes a board configured to control a printing unit operating in the printer that performs printing on a medium, and a heat sink including a counter surface that is provided to face a board surface of the board and that has a shape with a length in a first direction X longer than a length in a second direction Y intersecting the first direction X in a plan view, and configured to receive heat generated in the board with the counter surface and dissipate the heat to the outside. The counter surface includes a slit penetrating the counter surface and extending in the second direction Y.

6 Claims, 12 Drawing Sheets

PRINTING APPARATUS

BACKGROUND

1. Technical Field

The invention relates to a printing apparatus that performs printing on a medium.

2. Related Art

A printing apparatus typified by an ink jet-type printer is provided with an electronic circuit board (hereinafter simply referred to as a board) that is configured to control operations of various drive systems in the printing apparatus. For example, a printing head that performs printing on a medium is provided on a head driving board.

A heat sink that dissipates heat generated in the board may be provided on such a board (for example, JP-A-2012-187838).

An electronic component is mounted on a typical printed circuit board as a board by soldering. Soldering is performed by a reflow method of applying solder to a printed circuit board in advance, and heating and melting the solder after an electronic component is placed on the solder.

When an electronic component is mounted by the reflow method, a board may be warped due to multi-layering of a printed circuit board and high-density mounting of an electronic component. More specifically, a board may become warped by thermal expansion due to a layer configuration of a board or an imbalance in copper foil pattern when an electronic component is soldered by the reflow method, and a board may also become warped due to a difference in thermal expansion between a board and a mounted electronic component after soldering.

When a heat sink is attached to a warped board, a gap may be generated between the heat sink and the board, and heat may not be sufficiently transmitted from the board to the heat sink. This may cause a malfunction in the board and a mounted component.

SUMMARY

The invention has been made in view of such a situation, and an advantage of some aspects of the invention is to easily achieve a configuration in which a gap between a board and a heat sink is reduced when the board provided in a printing apparatus is warped, and to efficiently dissipate heat generated in the board.

To solve the problems described above, a printing apparatus according to a first aspect of the invention includes a board configured to control an operation unit operating in the printing apparatus that performs printing on a medium, and a heat sink including a counter surface that is provided to face a board surface of the board and that has a shape with a length in a first direction being longer than a length in a second direction intersecting the first direction in a plan view, and configured to receive heat generated in the board with the counter surface and dissipate the heat to the outside. The counter surface includes a slit penetrating the counter surface and extending in the second direction.

According to this aspect, the counter surface of the heat sink includes the slit penetrating the counter surface and extending in the second direction. Thus, the counter surface can be configured to be easily bent in the first direction as a longitudinal direction.

Consequently, when the board is bent in the first direction, space between the board surface of the board and the counter surface of the heat sink can be reduced by a shape of the counter surface of the heat sink that follows the bend in the board. Thus, heat generated in the board can be efficiently dissipated by the heat sink.

Note that examples of the operation unit operating in the printing apparatus that performs printing on a medium include a printing unit that performs printing on a medium, a conveyance unit that conveys a medium, a drying unit that dries a medium after printing, an operation panel that is for performing operations, for displaying settings and the like in the printing apparatus. As long as the operation unit is a structural unit that is provided in the printing apparatus and has operations controlled by the control board, a structural unit other than the structural units described above may be included.

In a second aspect of the invention according to the first aspect of the invention, a plurality of the slits is provided in the counter surface at intervals in the first direction.

According to this aspect, the counter surface can be configured to be more easily bent in the first direction as a longitudinal direction.

In a third aspect of the invention according to the first or second aspect of the invention, the counter surface includes a central region in the second direction, the slit not being formed across the first direction in the central region, a first end portion region located on one side of the central region in the second direction and provided with a first slit as the slit, and a second end portion region located on another side of the central region in the second direction and provided with a second slit as the slit.

According to this aspect, the counter surface includes the central region in the second direction, the slit not being formed across the first direction in the central region, the first end portion region located on one side of the central region in the second direction and provided with the first slit as the slit, and the second end portion region located on another side of the central region in the second direction and provided with the second slit as the slit. Thus, the counter surface of the heat sink can be configured to be more easily bent in the first direction as a longitudinal direction.

In a fourth aspect of the invention according to the third aspect of the invention, the first slit and the second slit are provided in the counter surface to sandwich the central region and face each other.

According to this aspect, the first slit and the second slit are provided in the counter surface to sandwich the central region and face each other. Thus, a twist is less likely to occur when the counter surface of the heat sink is bent, and generation of a gap between the board surface of the board and the counter surface can be effectively suppressed.

In a fifth aspect of the invention according to any one of the first to fourth aspects of the invention, the heat sink includes a bent surface extending from at least one end portion in the second direction of the counter surface to a direction intersecting the counter surface, and the slit is formed continuously from the counter surface to the bent surface.

According to this aspect, the heat sink includes the bent surface extending from at least one end portion in the second direction of the counter surface to the direction intersecting the counter surface, and the slit is formed continuously from the counter surface to the bent surface. Thus, heat dissipation properties in the heat sink can be increased while ease of bending of the counter surface in the first direction is maintained.

In a sixth aspect of the invention according to any one of the first to fifth aspects of the invention, the heat sink is attached to the board with a force acting in a direction from the counter surface toward the board.

According to this aspect, the heat sink is attached to the board in a state of the force acting in the direction from the counter surface toward the board. Thus, generation of a gap between the board surface of the board and the counter surface can be effectively suppressed.

In a seventh aspect of the invention according to any one of the first to sixth aspects of the invention, the printing apparatus further includes a printing unit configured to perform printing on the medium. The operation unit includes the printing unit, and the board is a driving board installed in the printing unit and configured to drive the printing unit.

According to this aspect, heat generated in the driving board used for causing the printing unit to operate can be suitably dissipated by the heat sink.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Exemplary Embodiment

Hereinafter, an ink jet-type printer 1 (hereinafter simply referred to as a printer 1) as one example of a printing apparatus of the invention will be described with reference to drawings. The printer 1 is a printing apparatus that discharges ink onto a fiber as a medium P and performs printing.

Note that X direction is a movement direction of a printing head and a width direction of the apparatus in an X-Y-Z coordinate system illustrated in each drawing. Y direction is a conveyance direction of the medium P. Z direction is a gravitational direction and indicates a height direction of the apparatus. +Z direction is toward an upper part (including an upper portion, an upper surface, and the like) of the apparatus, and −Z direction side is toward a lower part (including a lower portion, a lower surface, and the like) of the apparatus.

Overview of Printer

Figure 1:
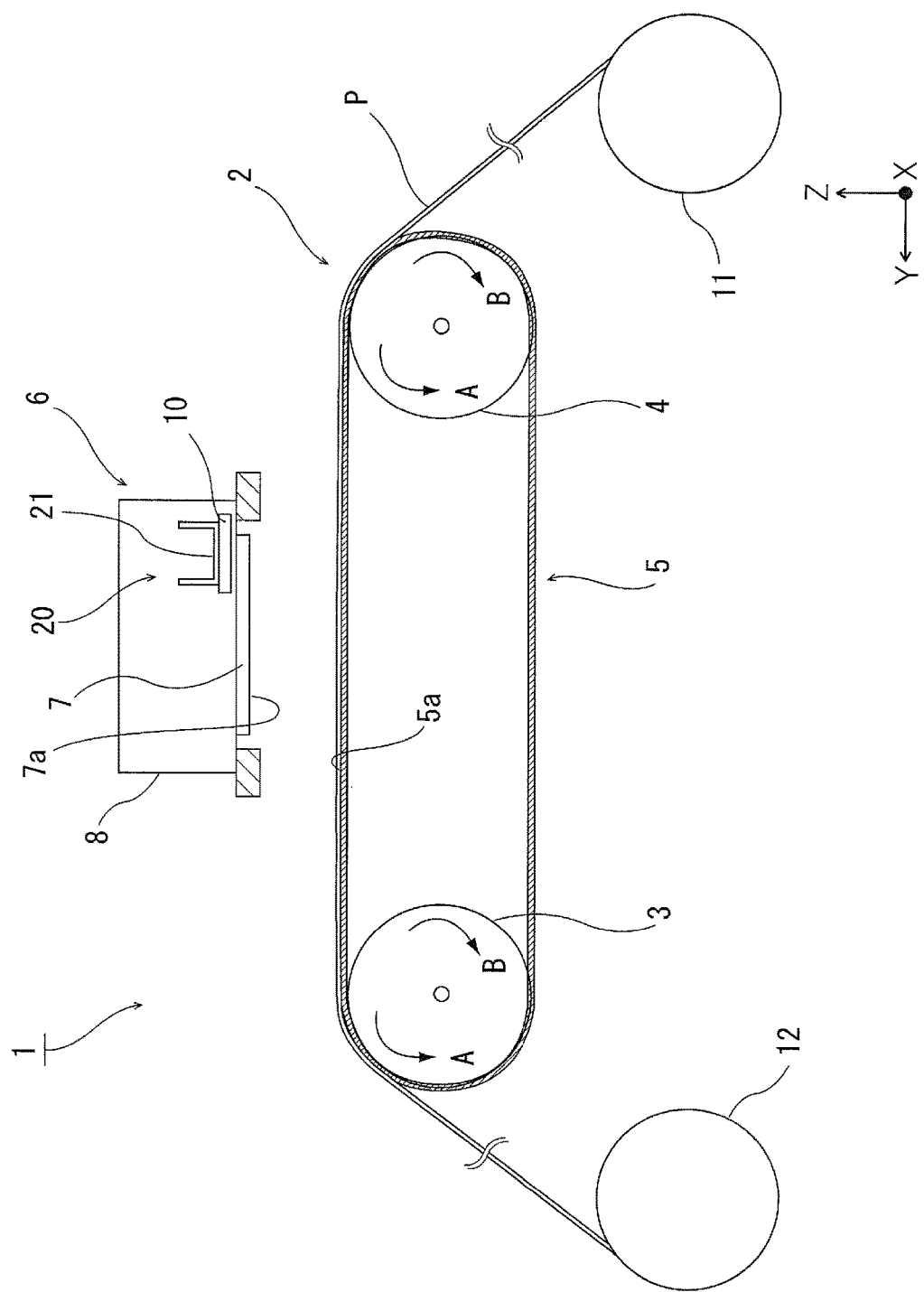
FIG. 1 is a schematic side view illustrating a printer according to the invention.

The printer 1 in the exemplary embodiment illustrated in FIG. 1 includes, as one example, a medium conveyance device 2 (also refer to FIG. 2) that conveys the medium P in the conveyance direction (+Y direction) by a conveyance belt 5. The conveyance belt 5 supports the medium P by a support surface 5a provided with an adhesive. The medium conveyance device 2 conveys the medium P by rotating the conveyance belt 5. The printer 1 further includes a feeding unit 11 that allows a roll-type medium P to be placed therein and can feed the medium P onto the conveyance belt 5 of the medium conveyance device 2.

Examples of the medium P used in the printer 1 include fabrics made from fibers such as cotton, silk, wool, synthetic fiber, or mixed fabrics, and a paper medium such as roll paper.

The medium conveyance device 2 includes a first roller 3 driven by a driving source, which is not illustrated, a second roller 4 disposed at a distance from the first roller 3, and the conveyance belt 5 running across the first roller 3 and the second roller 4. In the exemplary embodiment, the second roller 4 is a driven roller rotationally driven by rotation of the first roller 3. However, the second roller 4 may be a driving roller driven by a drive source, similarly to the first roller 3.

The conveyance belt 5 is an endless belt. The conveyance belt 5 may be formed of an elastic material such as rubber and resin, and may also be formed of a metallic material.

The conveyance belt 5 in the exemplary embodiment is configured to allow the medium P to be attached to the conveyance belt 5 with an adhesive, but the conveyance belt 5 is not limited to such a configuration. For example, the conveyance belt 5 may be configured to allow the medium P to be attached to the conveyance belt 5 by electrostatic adsorption or suction adsorption.

The first roller 3 is configured to be rotatable in a first rotation direction A illustrated in FIG. 1. The second roller 4 rotationally driven by the first roller 3 is also configured to be rotatable in the first rotation direction A.

When the first roller 3 is rotated in the first rotation direction A, the conveyance belt 5 is also rotated in the first rotation direction A. At this time, the support surface 5a moves in the +Y direction, and the medium P supported by the support surface 5a is conveyed in the +Y direction. The +Y direction is the conveyance direction of the medium P when a printing head 7 performs printing on the medium P.

Note that the first roller 3 and the second roller 4 are also configured to be rotatable in a second rotation direction B opposite to the first rotation direction A, and the support surface 5a moves in a −Y direction when the first roller 3 is rotated in the second rotation direction B.

Figure 2:
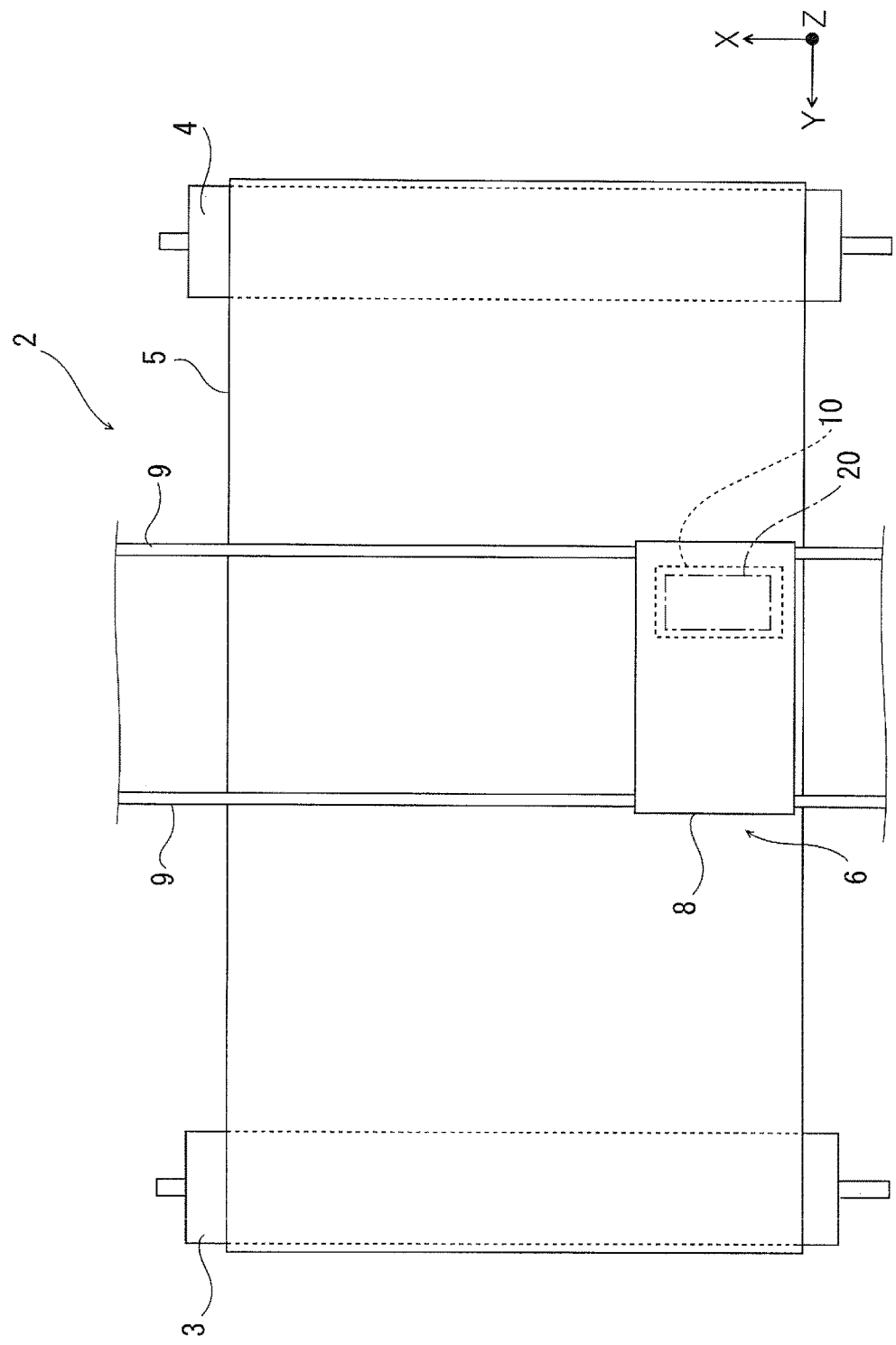
FIG. 2 is a schematic plan view illustrating the printer according to the invention.

The printer 1 further includes a printing unit 6 that performs printing on the medium P supported and conveyed by the support surface 5a of the conveyance belt 5. The printing unit 6 includes the printing head 7 that discharges ink as "liquid" and a carriage 8 that holds the printing head 7 and can move back and forth in the width direction (X-axis direction) intersecting the conveyance direction (+Y direction) of the medium P. As illustrated in FIG. 2, the carriage 8 moves along guide rails 9 extending along the width direction.

The printing head 7 discharges ink (liquid) from a liquid discharging surface 7a and performs printing on the medium P being conveyed below the liquid discharging surface 7a.

At the time of printing, the printer 1 in the example causes the carriage 8 including the printing head 7 to move back and forth in the X-axis direction and performs printing, and the medium conveyance device 2 stops the medium P from being conveyed during printing (while the carriage 8 is moving). In other words, the back and forth movement of the carriage 8 and the conveyance of the medium P are performed alternately for printing. That is, the medium conveyance device 2 intermittently conveys the medium P (intermittently moves the conveyance belt 5) in accordance with the back and forth movement of the carriage 8.

The medium P after printing by the printing head 7 is configured to be wound into a roll form by a winding unit 12 provided downstream of the first roller 3 in the conveyance direction.

Note that the printing unit 6 may be a line head type capable of discharging liquid across the width direction (X-axis direction) of the medium P without moving the printing head back and forth in the X-axis direction.

As illustrated in FIG. 1, a board 10 configured to control the printing unit 6 is installed in the printing unit 6. A plurality of electronic components 13*a* to 13*h* (refer to FIG. 4) constituting a circuit are installed on the board 10. Hereinafter, the electronic components 13*a* to 13*h* are collectively referred to as an electronic component 13. The electronic component 13 is soldered by reflow processing.

The board 10 is provided with a heat sink 20 that dissipates heat generated in the board 10. The printing unit 6 is one example of an "operation unit" that operates in the printer 1. In other words, the operation unit includes the printing unit 6. The board 10 is a circuit board that is installed in the printing unit 6 performing printing on the medium P and drives the printing unit 6. For example, the board 10 controls operations, such as discharge of ink from the printing head 7 and movement of the carriage 8, by a control circuit provided on the board 10.

The board 10, by providing with the heat sink 20, is enabled to have a configuration in which heat generated in the board 10 is suitably dissipated. Note that the heat sink 20 in the exemplary embodiment is preferably applied to an operation unit having a great amount of heat generation. The reason is that the operation unit having a great amount of heat generation is particularly likely to become deformed, and thus a gap is likely to be generated between the operation unit and the heat sink 20. Since the printing unit 6 is one of operation units having a great amount of heat generation, providing the heat sink 20 in the exemplary embodiment is especially effective.

Hereinafter, a configuration of the heat sink 20 provided on the board 10 will be described in detail.

With Regard to the Heat Sink

Hereinafter, the heat sink 20 provided on the board 10 will be described with reference to FIGS. 3 to 12.

Figure 4:
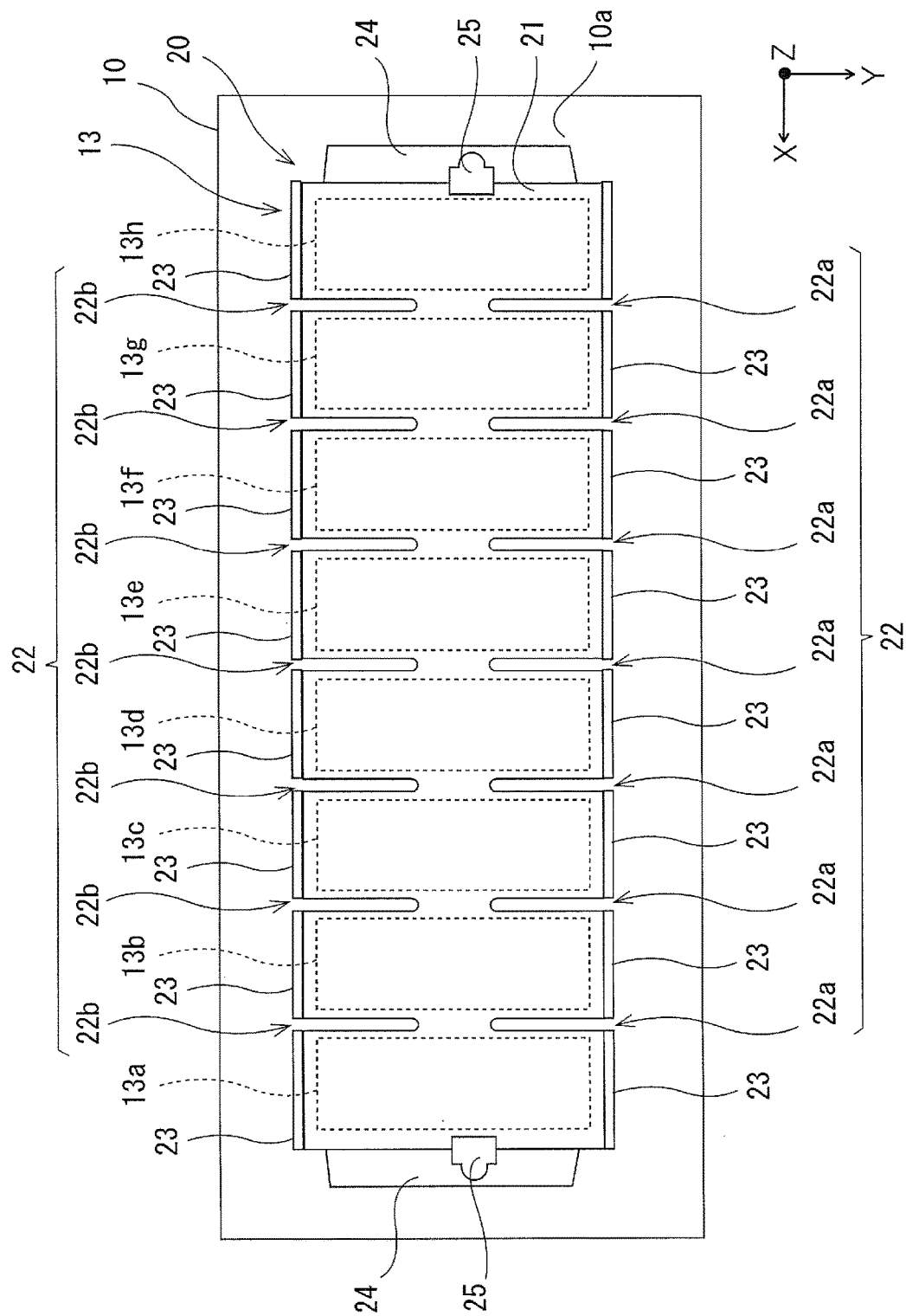
FIG. 4 is a plan view illustrating a state where the heat sink is attached to the board.

The heat sink 20 includes a counter surface 21 provided to face a board surface of the board 10. As illustrated in FIG. 4, the counter surface 21 has a shape in a length of the X-axis direction (hereinafter referred to as a first direction X) as a first direction is longer than a length of a Y-axis direction (hereinafter referred to as a second direction Y) as a second direction intersecting the first direction X in a plan view. The heat sink 20 receives heat generated in the board 10 with the counter surface 21 and dissipates the heat to the outside.

The heat sink 20 is formed of a material having high heat conductivity. For example, the heat sink 20 may be made of metal such as copper or aluminum.

Figure 3:
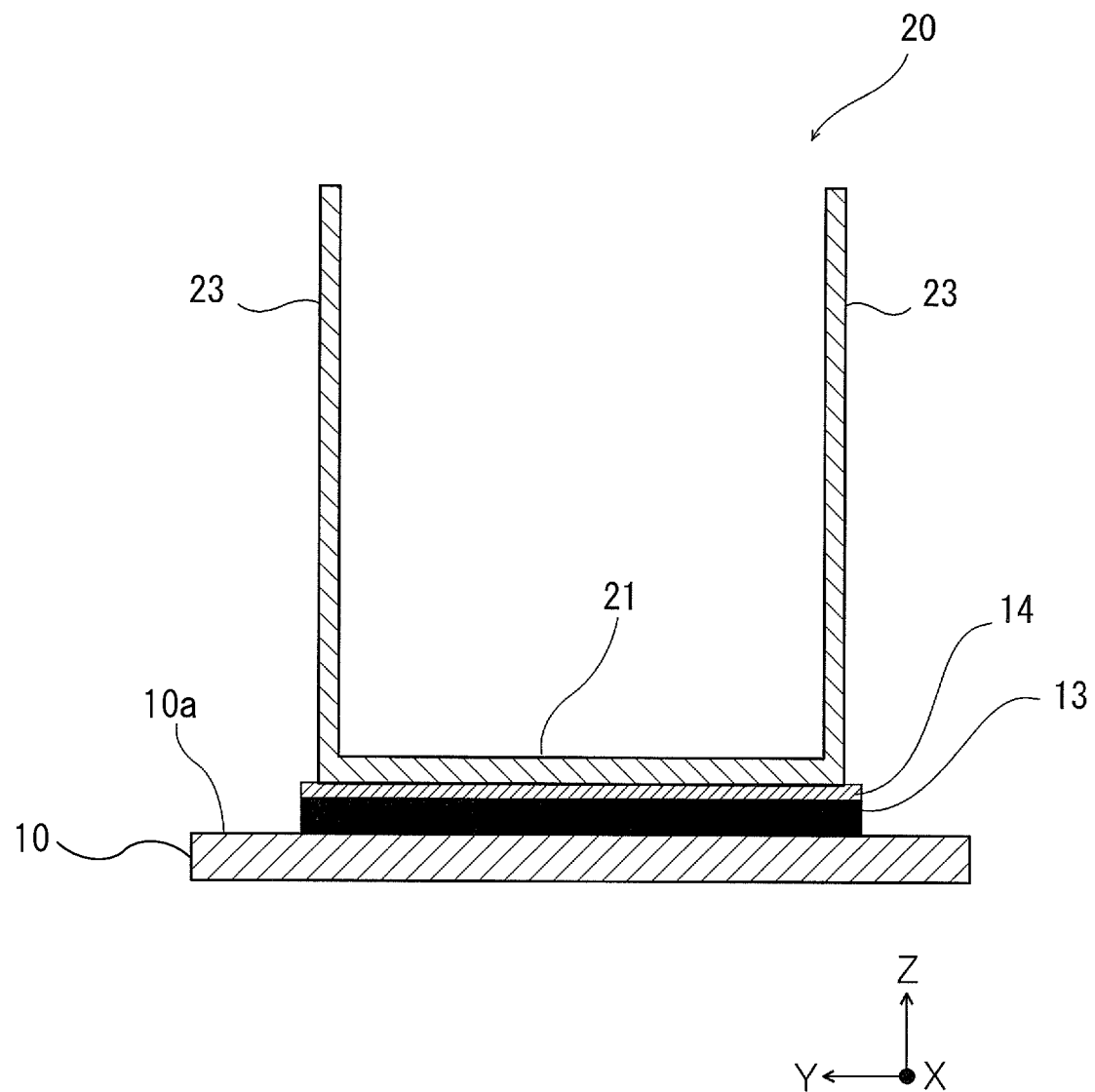
FIG. 3 is a Z-Y plane cross-sectional view illustrating a state where a heat sink is attached to a board.

In FIG. 3, a heat dissipation sheet 14 is provided between a board surface 10*a* of the board 10 on which the electronic component 13 is mounted and the counter surface 21. The heat dissipation sheet 14 is used for increasing adhesion properties between the board surface 10*a* and the counter surface 21. Grease may be applied instead of the heat dissipation sheet 14.

The counter surface 21 includes a slit 22 penetrating the counter surface 21 and extending in the second direction Y. In the exemplary embodiment, a plurality of slits 22 are provided at intervals in the first direction X.

Herein, when the electronic component 13 is soldered, the board 10 may become warped due to a difference in coefficient of thermal expansion between the solder and the board or application of heat to a part of the board 10.

In particular, when the board 10 has a length in the first direction X longer than its length in the second direction Y as illustrated in FIG. 4, a warp is more likely to occur in the first direction X as a longitudinal direction.

Figure 8:
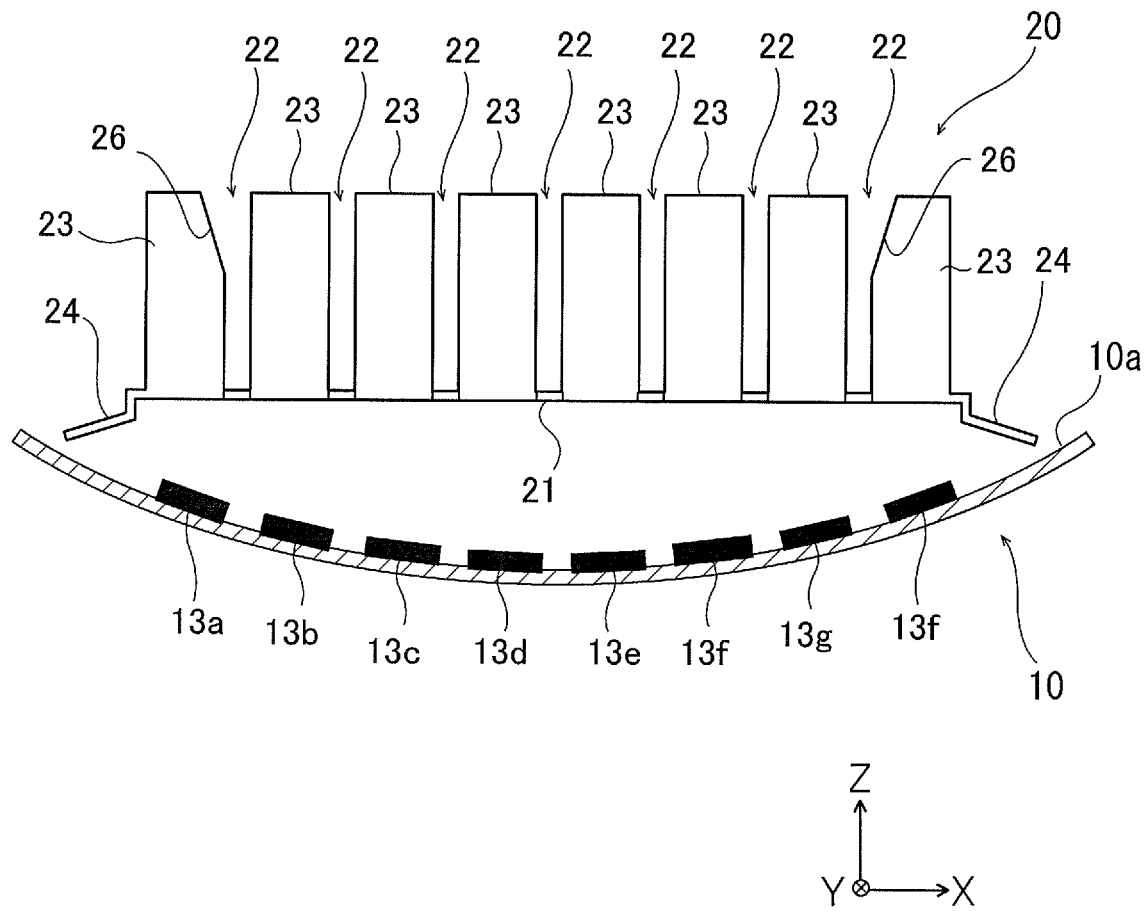
FIG. 8 is a front view illustrating a state before the heat sink is attached to a warped board.

The heat sink 20 is attached after the electronic component 13 is soldered. However, when the board 10 is warped with the board surface 10*a* being inward as illustrated in FIG. 8, space is generated between the counter surface 21 and the board surface 10*a* of the board 10. This makes it difficult to transmit heat generated in the board 10 to the counter surface 21, resulting in insufficient heat dissipation from the board 10.

In the exemplary embodiment, the counter surface 21 of the heat sink 20 includes the slits 22, so that the counter surface 21 is easily bent in the first direction X as the longitudinal direction.

Figure 9:
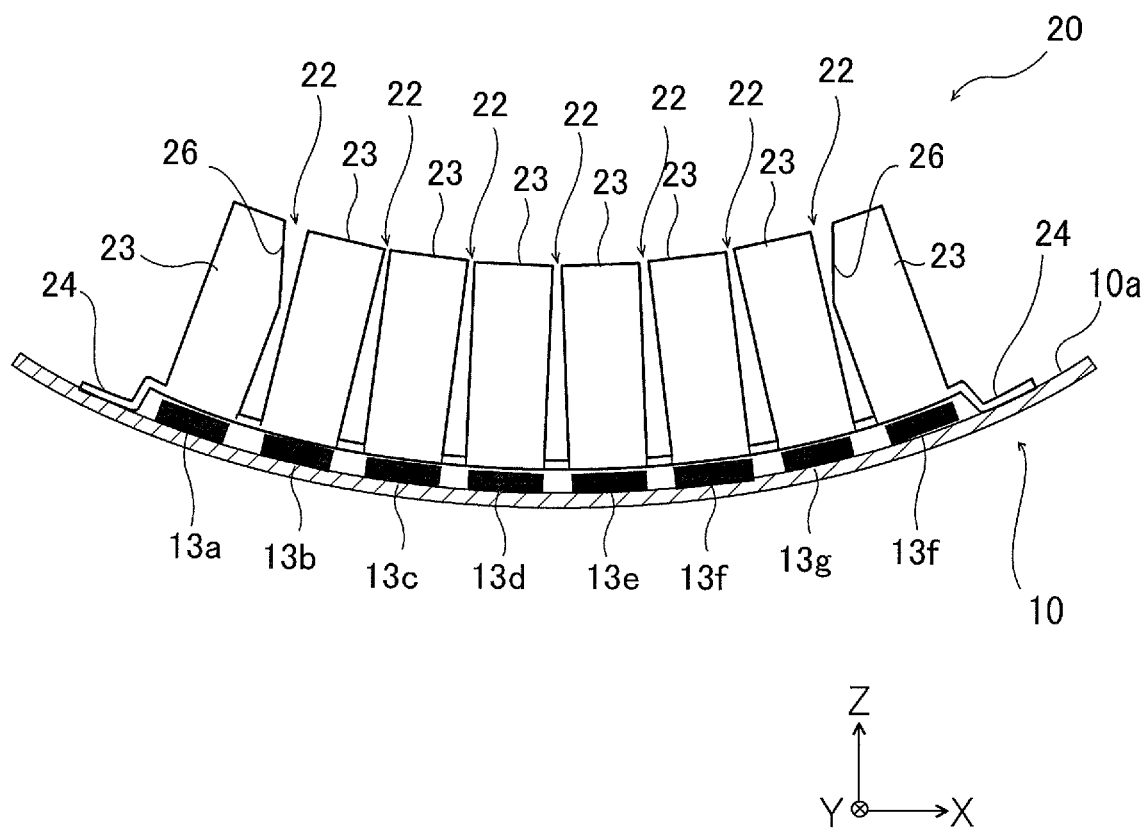
FIG. 9 is a front view illustrating a state where the heat sink is attached to the warped board.

Consequently, when the board 10 is bent in the first direction X, the space between the board surface 10*a* of the board 10 and the counter surface 21 of the heat sink 20 can be reduced by a shape of the counter surface 21 of the heat sink 20 that follows the bend in the board 10 (state as illustrated in FIG. 9 as one example). Thus, the heat sink 20 can efficiently dissipate heat generated in the board 10.

While at least one slit 22 may be provided in the first direction X, the plurality of slits 22 provided in the first direction X can make it easier to bend the counter surface 21 in the first direction X.

Hereinafter, the configuration of the heat sink 20 in the exemplary embodiment will be further described.

Figure 6:
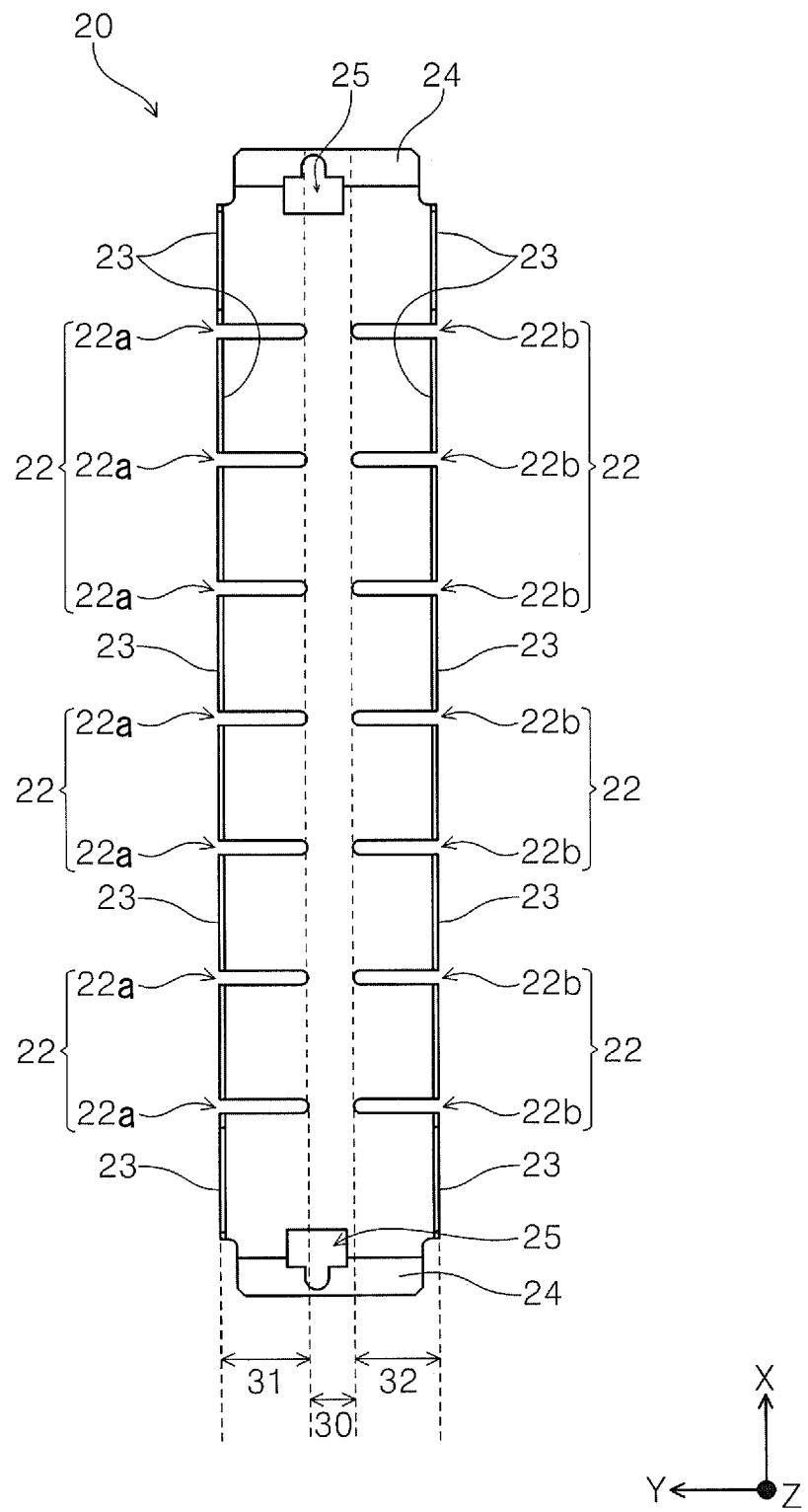
FIG. 6 is a plan view illustrating the heat sink.

As illustrated in FIG. 6, the counter surface 21 includes a central region 30 in the second direction Y in which the slits 22 are not formed across the first direction X, a first end portion region 31 located on one side (+Y side) of the central region 30 in the second direction Y and provided with a first slit 22*a* as the slit 22, and a second end portion region 32 located on the other side (−Y side) of the central region 30 in the second direction Y and provided with a second slit 22*b* as the slit 22.

With this configuration, the counter surface 21 can be configured to be more easily bent in the first direction X as the longitudinal direction.

The first slit 22*a* and the second slit 22*b* are provided in the counter surface 21 illustrated in FIG. 6 in such a way as to sandwich the central region 30 and face each other.

In other words, each slit of the first slits 22*a* and each slit of the second slits 22*b* are provided in the same position in the first direction X.

This configuration makes a twist less likely to occur when the counter surface 21 of the heat sink 20 is bent, and can thus effectively suppress generation of a gap between the board surface 10*a* of the board 10 and the counter surface.

Figure 5:
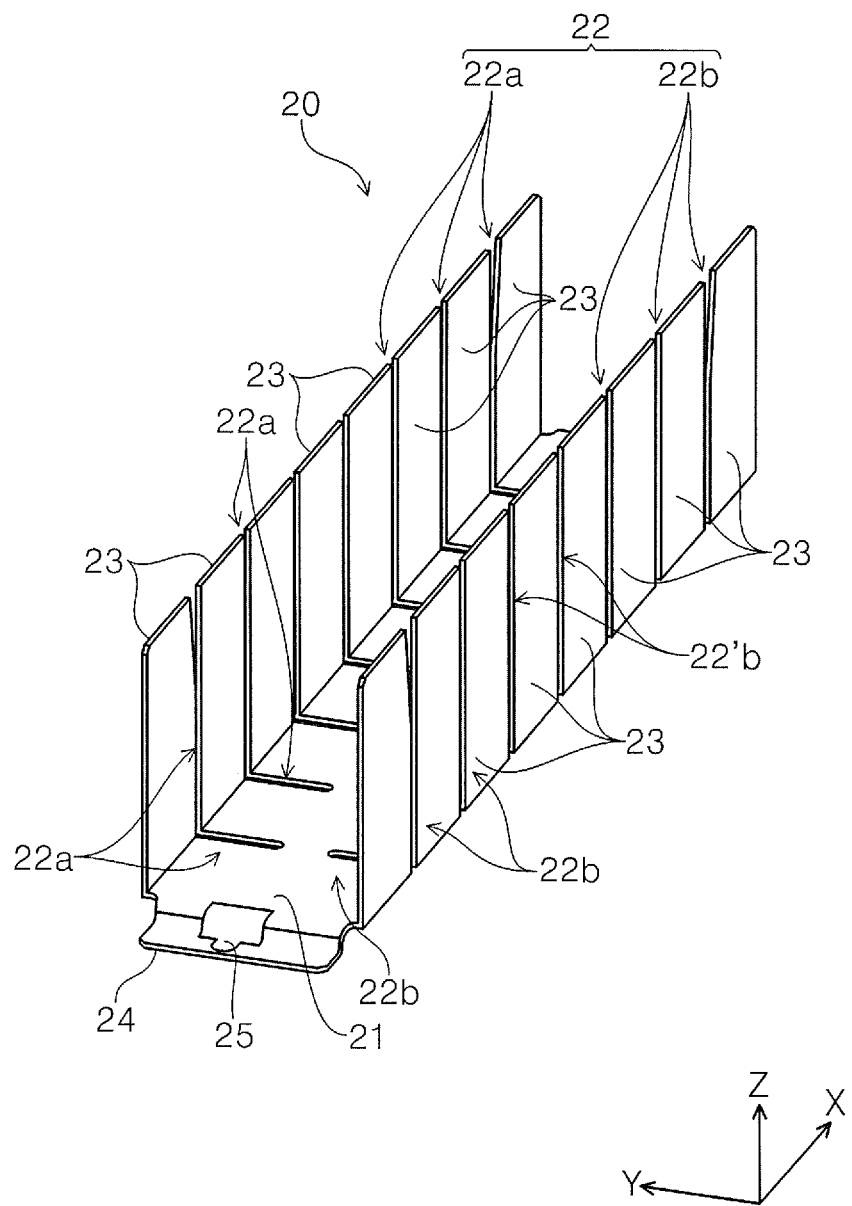
FIG. 5 is a perspective view illustrating the heat sink.

Furthermore, as illustrated in FIG. 5, the heat sink 20 includes bent surfaces 23 extending from end portions on both sides in the second direction Y of the counter surface 21 in the Z direction intersecting the counter surface 21. The heat sink 20 includes the bent surfaces 23, resulting in an increase in a heat dissipation area. Thus, providing the bent surfaces 23 can increase heat dissipation properties of the heat sink 20. At this time, the slits 22 (first slits 22a and second slits 22b) are formed continuously from the counter surface 21 to the bent surfaces 23. Thus, even with the bent surfaces 23, ease of bending of the counter surface 21 in the first direction X can be maintained.

In summary, the heat sink 20 includes the bent surfaces 23, and the slits 22 are formed continuously from the counter surface 21 to the bent surfaces 23, so that the heat dissipation properties in the heat sink 20 can be increased while ease of bending of the counter surface 21 in the first direction X is maintained.

Note that the bent surfaces 23 may be provided only at an end portion on one side instead of both sides in the second direction Y of the counter surface 21. In other words, the bent surface 23 may extend from an end portion on at least one side in the second direction Y of the counter surface 21. However, a greater total area of the bent surface 23 increases the heat dissipation properties of the heat sink 20, so that a greater number of the bent surfaces 23 is more likely to increase the heat dissipation properties of the heat sink 20.

Figure 10:
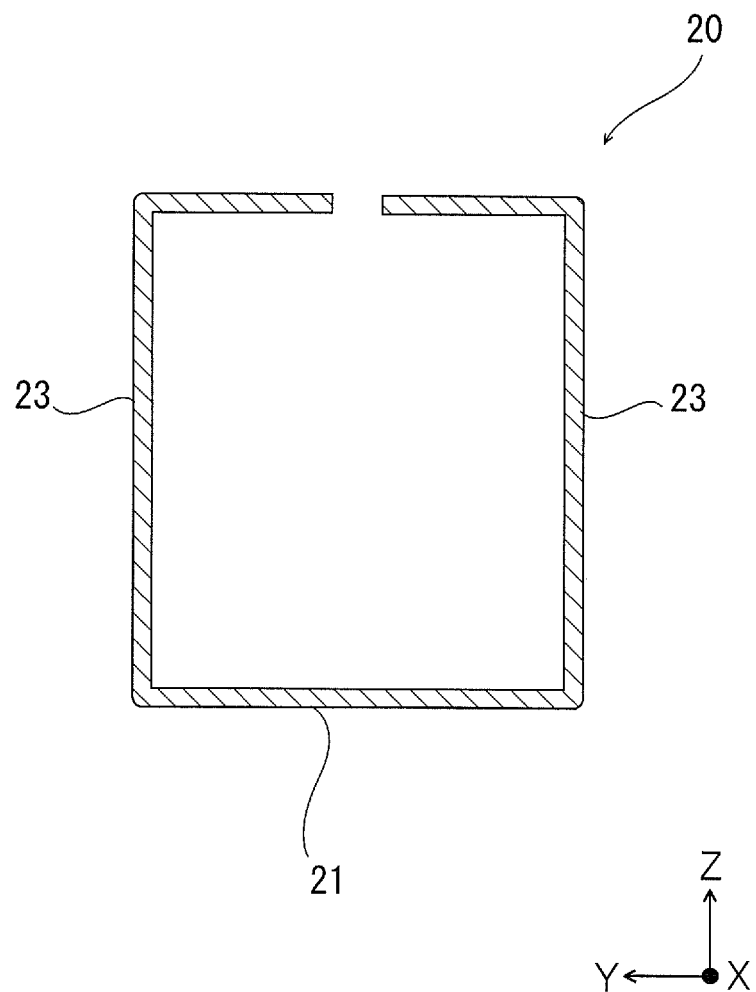
FIG. 10 is a side view illustrating a modified example of the heat sink.
Figure 11:
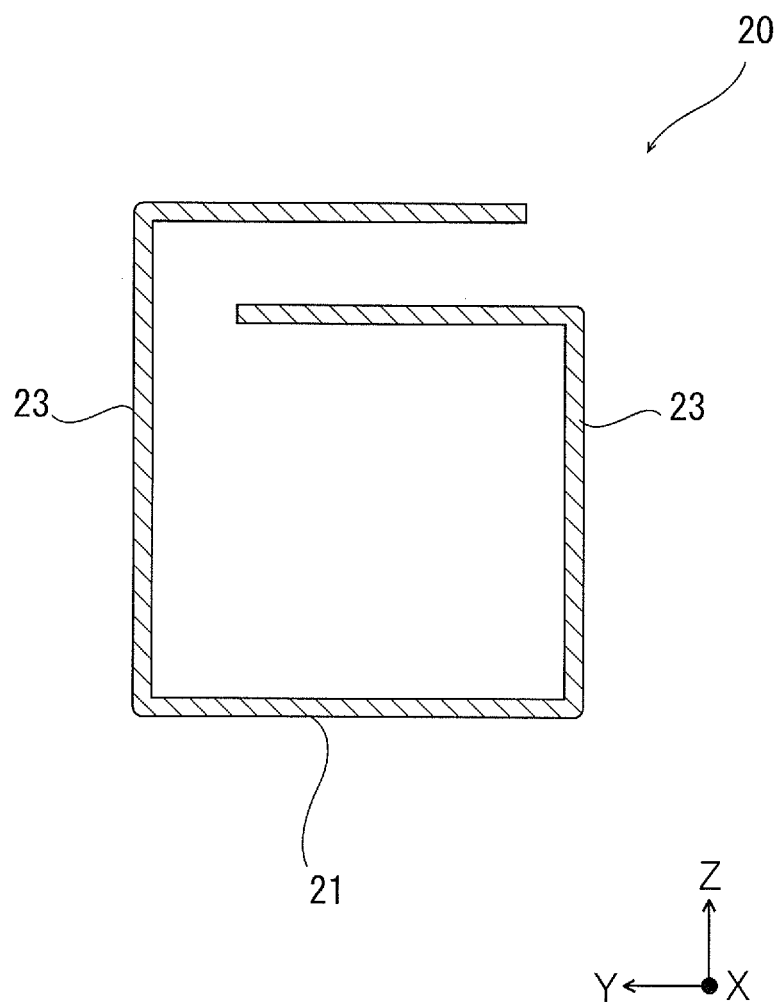
FIG. 11 is a side view illustrating another modified example of the heat sink.
Figure 12:
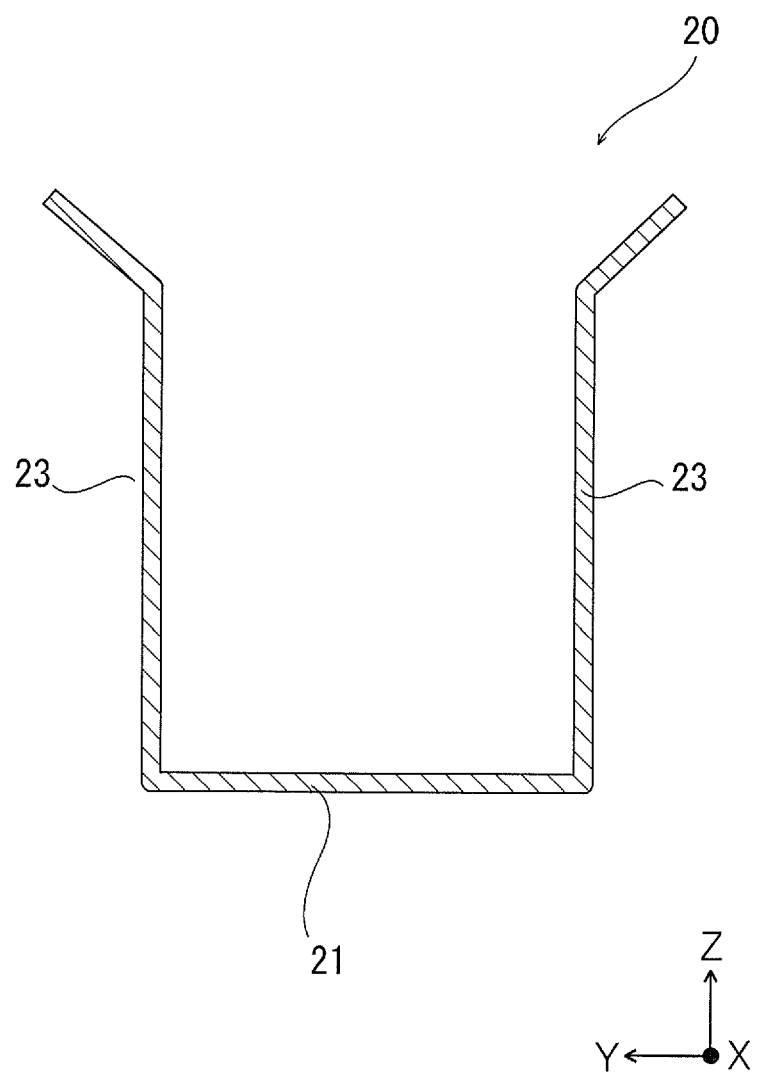
FIG. 12 is a side view illustrating yet another modified example of the heat sink.

Note that a shape of the bent surfaces 23 having bent tips as illustrated in FIG. 10 can increase a surface area and efficiency of heat dissipation while avoiding an increase in size of the heat sink 20 in the height direction (Z-axis direction). As illustrated in FIG. 11, tips of the bent surfaces 23 may be bent at different bending heights of the bent surfaces 23 on the +Y side and the −Y side. As illustrated in FIG. 12, tips of the bent surfaces 23 may also be bent outwardly in the second direction Y.

With Regard to Attachment of Heat Sink

As illustrated in FIG. 8, the heat sink 20 is attached to the board 10 via attaching portions 24 provided at both ends in the first direction X of the counter surface 21. The attaching portion 24 is provided with an attachment hole 25. A screw is inserted into the attachment hole 25, and the screw inserted into the attachment hole 25 fits in an attached portion, which is not illustrated, provided in the board 10 in such a way that the heat sink 20 is fixed to the board 10. At this time, the heat sink 20 is attached to the board 10 with a force acting in a direction from the counter surface 21 toward the board 10.

More specifically, as illustrated in FIG. 8, the attaching portion 24 is inclined downwardly with respect to the counter surface 21 toward the tip, that is, the attaching portion 24 is inclined in an attachment direction toward the board 10. When the attaching portions 24 are attached along the board surface 10a of the board 10 as illustrated in FIG. 9, the counter surface 21 is bent by the action of force in the direction toward the board 10 and securely fits along the board 10 with the board surface 10a being warped inwardly. In this way, generation of a gap between the board surface 10a of the board 10 and the counter surface 21 can be effectively suppressed.

Note that while the board 10 with the board surface 10a being warped inwardly is taken as an example in the exemplary embodiment, the heat sink 20 may also be deformed to follow a bend of a warp in the board with the board surface 10a being warped outwardly and then attached to the board.

Other Configuration of Heat Sink

Figure 7:
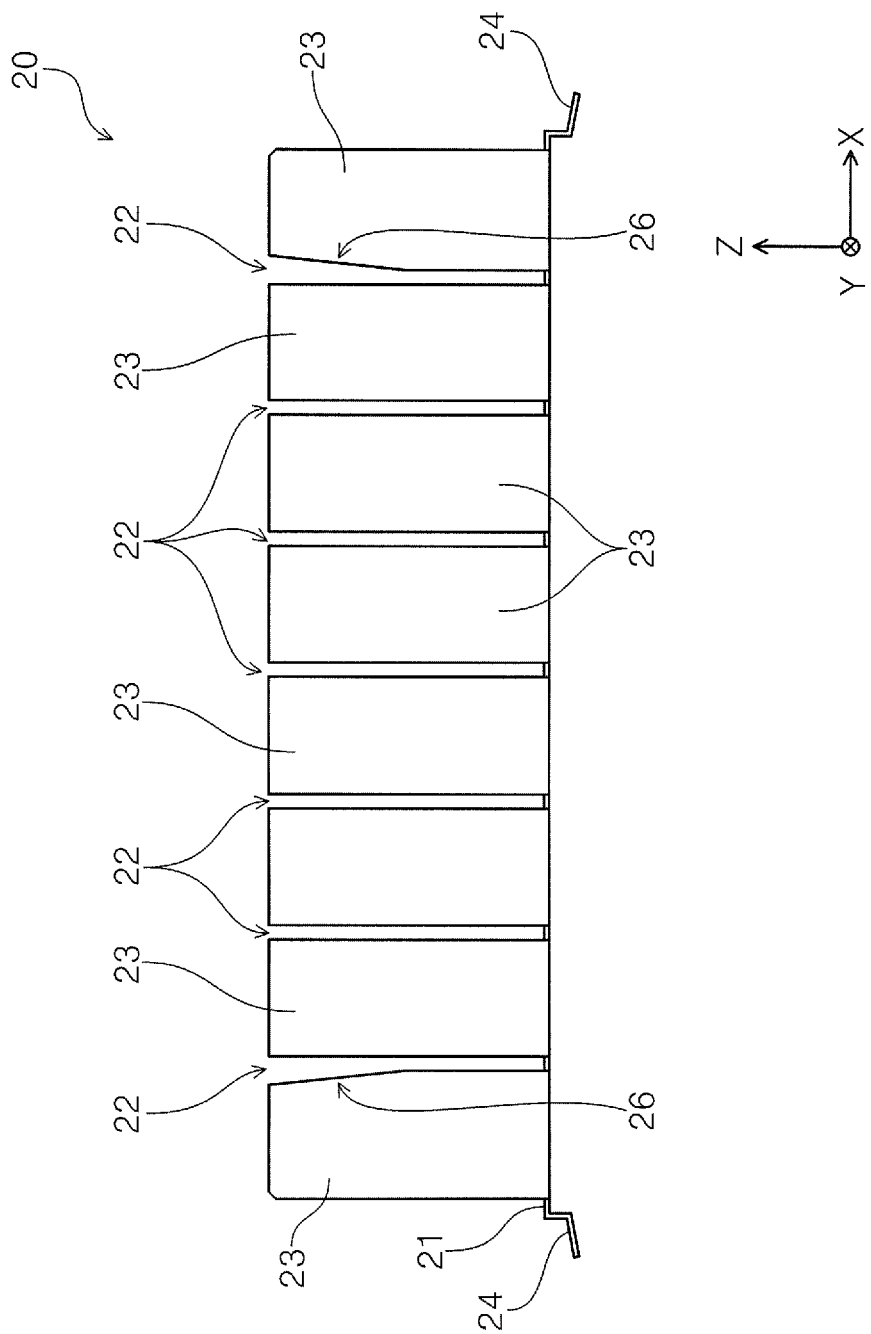
FIG. 7 is a front view illustrating the heat sink.

As illustrated in FIGS. 7 and 8, a notch portion 26 is provided inside a tip of each of the bent surfaces 23 located at the end portions on both sides in the first direction X among the plurality of bent surfaces 23 of the heat sink 20.

When the heat sink 20 is bent as illustrated in FIG. 9, the bent surfaces 23 are inclined toward the inside of the bend. Accordingly, the tips of the bent surfaces 23 adjacent to each other in the first direction X come closer, and the slit 22 tapers down. The bent surfaces 23 located closer to the outside in the first direction X are more greatly inclined to the inside. Thus, the tips of the bent surfaces 23 located closest to the outside may contact bent surfaces 23 located on the inner sides of the bent surfaces 23 located closest to the outside depending on a degree of the bend. In the exemplary embodiment, the notch portions 26 provided in the bent surfaces 23 located at the end portions on both sides in the first direction X can suppress contact of the tips of the bent surfaces 23 located closest to the outside with bent surfaces 23 on the inner sides of the bent surfaces 23 located closest to the outside.

The notch portion 26 may also be provided in another bent surface 23 in addition to the bent surfaces 23 located closest to the outside in the first direction X.

The slits 22 are divided according to arrangement of the electronic component 13 provided on the board 10 in the exemplary embodiment. For example, as illustrated in FIG. 4, the slit 22 is located between the electronic components 13 adjacent to each other like the electronic components 13a and 13b and the electronic components 13b and 13c, for example. Note that each of the electronic component 13a to the electronic component 13h may not be one electronic component and may be formed as an electronic unit such as a circuit formed of a plurality of electronic components.

The slits 22 may also be formed at regular intervals regardless of arrangement of the electronic component 13 on the board 10 side.

A heat sink having the same configuration as that in the exemplary embodiment may be provided on another board including an electronic circuit that drives an operation unit other than the printing unit 6. For example, a heat sink having the same configuration as that in the exemplary embodiment may be adopted as a heat sink of a board that controls operations of, for example, the first roller 3, a drying unit (not illustrated) that dries the medium P after printing, an operating panel (not illustrated) that is for performing operations and for displaying settings and the like in the printer 1, and the like serving as operation units other than the printing unit 6.

In addition, the invention is not intended to be limited to the aforementioned exemplary embodiments, and many variations are possible within the scope of the invention as described in the appended claims. It goes without saying that such variations also fall within the scope of the invention.

For example, the printing apparatus according to the invention may not only be a printing apparatus that performs printing on a fabric as the medium P, but may also be a printing apparatus that performs printing on a sheet of printing paper (that may be a cut sheet or roll paper) as the medium P.

This application claims priority under 35 U.S.C. § 119 to Japanese Patent Application No. 2018-039990, filed Mar. 6, 2018. The entire disclosure of Japanese Patent Application No. 2018-039990 is hereby incorporated herein by reference.

What is claimed is:

1. A printing apparatus comprising:
   a board configured to control an operation unit operating in the printing apparatus that performs printing on a medium; and
   a heat sink including a counter surface that is provided to face a board surface of the board and that has a shape with a length in a first direction longer than a length in a second direction intersecting the first direction in a plan view, and configured to receive heat generated in the board with the counter surface and dissipate the heat to the outside, wherein the counter surface includes:
- a slit penetrating the counter surface and extending in the second direction,
- a central region in which the slit is not formed from one end to the other end of the counter surface in the first direction, the central region being a region in the second direction,
- a first end portion region located on one side of the central region in the second direction and provided with a first slit as the slit, and
- a second end portion region located on the other side of the central region in the second direction and provided with a second slit as the slit, a first electronic component and a second electronic component constituting a circuit of the board are disposed side by side in the first direction on the board surface so as to overlap the central region in a plan view, and the first slit and the second slit are disposed so as to overlap a boundary between the first electronic component and the second electronic component in the first direction.

2. The printing apparatus according to claim 1, wherein a plurality of the slits are provided in the counter surface at intervals in the first direction.

3. The printing apparatus according to claim 1, wherein the first slit and the second slit are provided to be opposite to each other across the central region.

4. The printing apparatus according to claim 1, wherein the heat sink includes a bent surface extending from at least one end portion in the second direction of the counter surface to a direction intersecting the counter surface, and
the slit is formed continuously from the counter surface to the bent surface.

5. The printing apparatus according to claim 1, wherein the heat sink is attached to the board with a force acting in a direction from the counter surface toward the board.

6. The printing apparatus according to claim 1, further comprising:
a printing unit configured to perform printing on the medium, wherein
the operation unit includes the printing unit, and
the board is a driving board installed in the printing unit and configured to drive the printing unit.

* * * * *